(12) United States Patent
Yoshida et al.

(10) Patent No.: US 6,905,810 B2
(45) Date of Patent: Jun. 14, 2005

(54) PERMANENT RESIST, PERMANENT RESIST-LAMINATED SUBSTRATE AND PROCESS FOR PRODUCING THE SAME

(75) Inventors: Tetsuya Yoshida, Hitachi (JP); Naoki Sasahara, Hitachi (JP); Katsunori Tsuchiya, Hitachi (JP); Akio Nakano, Hitachi (JP)

(73) Assignee: Hitachi Medical Co., Ltd., Tokyo (JP)

( * ) Notice: Subject to any disclaimer, the term of this patent is extended or adjusted under 35 U.S.C. 154(b) by 33 days.

(21) Appl. No.: 10/455,375

(22) Filed: Jun. 6, 2003

(65) Prior Publication Data

US 2004/0253540 A1 Dec. 16, 2004

(51) Int. Cl.$^7$ .............................. G03F 7/033; G03F 7/40
(52) U.S. Cl. ................... 430/281.1; 430/270.1; 430/284.1; 430/320; 430/328; 430/330
(58) Field of Search .......................... 430/270.1, 281.1, 430/284.1, 320, 328, 330

(56) References Cited

U.S. PATENT DOCUMENTS

| | | | | |
|---|---|---|---|---|
| 6,583,198 B2 | * | 6/2003 | Sato et al. | ................... 522/100 |
| 6,692,793 B2 | * | 2/2004 | Sato et al. | ................... 427/510 |
| 2002/0169226 A1 | * | 11/2002 | Sato et al. | ................... 521/100 |

FOREIGN PATENT DOCUMENTS

JP           2002-162739           6/2002

* cited by examiner

Primary Examiner—Yvette C. Thornton
(74) Attorney, Agent, or Firm—Griffin & Szipl, P.C.

(57) ABSTRACT

A permanent resist obtained by at least photoexposure and alkali development of a photosensitive resin composition, the permanent resist containing a metal carboxylate group, or a carboxyl group (a carboxyl anhydride group is also included among a carboxyl group according to the invention) and a metal carboxylate group, wherein an alkaline earth metal carboxylate group constitutes at least 30 mole percent of the total of a carboxyl group and a metal carboxylate group.

13 Claims, No Drawings

PERMANENT RESIST, PERMANENT RESIST-LAMINATED SUBSTRATE AND PROCESS FOR PRODUCING THE SAME

This application claims priority from U.S. patent application Ser. No. 10/455,375, filed Jun. 6, 2003, which is based on Japanese Patent Application No. P2000-359530 filed Nov. 27, 2000, the entire disclosures of which are incorporated herein by reference.

BACKGROUND OF THE INVENTION

1. Field of the Invention

The present invention relates to a permanent resist, and to a permanent resist-laminated substrate and a process for producing a permanent resist-laminated substrate.

2. Related Background Art

Permanent resists are formed on printed wiring boards by a process whereby an active light ray is irradiated in a pattern on a photosensitive resin composition layer formed on a substrate, development is carried out with a developing solution dissolving an alkali metal salt (sodium carbonate, potassium carbonate, etc.), and the substrate is rinsed with purified water or the like. The process usually employs ultraviolet irradiation with a high-pressure mercury lamp, or heating, in order to improve the flexibility, soldering heat resistance, chemical resistance and the like.

In the aforementioned developing method, however, inadequate processing by water rinsing (due to insufficient temperature or time) causes the physically unstable monovalent metal cations ($Na^+$, $K^+$, etc.) from the developing solution to remain on the surface of the permanent resist, leading to such problems as a reduced moisture-resistant insulating property for humid conduction, or electrical signal malfunctions.

SUMMARY OF THE INVENTION

It is therefore an object of the present invention to provide a permanent resist which exhibits a moisture-resistant insulating property along with excellent flexibility, soldering heat resistance and chemical resistance. It is another object of the invention to provide a permanent resist-laminated substrate comprising such a permanent resist, as well as a process for its fabrication.

In order to achieve the aforestated objects, the present invention provides a permanent resist obtained by at least photoexposure and alkali development of a photosensitive resin composition, the permanent resist containing a metal carboxylate group, or a carboxyl group (a carboxyl anhydride group is also included among a carboxyl group according to the invention) and a metal carboxylate group, wherein an alkaline earth metal carboxylate group constitutes at least 30 mole percent of the total a carboxyl group and a metal carboxylate group.

In this permanent resist, the alkaline earth metal carboxylate group preferably constitute at least 50 mole percent (even more preferably at least 70 mole percent) of the total a carboxyl group and a metal carboxylate group. The alkaline earth metal is preferably calcium or magnesium. A permanent resist-laminated substrate may be obtained by forming the permanent resist on a substrate.

The permanent resist of the invention exhibits not only excellent flexibility, soldering heat resistance and chemical resistance, but also a satisfactory moisture-resistant insulating property for humid conduction, and therefore electronic parts comprising permanent resist-laminated substrates fabricated by laminating this permanent resist on substrates are resistant to malfunction resulting from humidification. This effect may be attributed to the fact that the permanent resist contains a prescribed amount of an alkaline earth metal carboxylate.

A permanent resist-laminated substrate may be produced by the following process, for example. Specifically, the process which comprises (1) a first step of irradiating a layer of a photosensitive resin composition formed on a surface of a substrate with an active light ray, said photosensitive resin composition comprising a compound with a carboxyl group; (2) a second step of developing the irradiated layer on the surface of the substrate obtained in the first step with a developing solution; and (3) a third step of rinsing the surface obtained in the second step with a rinsing solution, wherein either or both said developing solution and rinsing solution contain an alkaline earth metal ion.

In this type of producing process, the alkaline earth metal ion content of the developing solution or rinsing solution may be 1–10,000 ppm (preferably 10–2000 ppm, and more preferably 50–500 ppm) based on weight, and the alkaline earth metal ion is preferably calcium ion or magnesium ion.

The photosensitive resin to be used for the photoexposure and alkali development may be a photosensitive resin composition comprising (A) a binder polymer, (B) a photopolymerizable compound having an ethylenically unsaturated group, and (C) a photoinitiator, wherein component (A) and/or component (B) comprises a compound with a carboxyl group.

Component (A) in this case preferably contains an ethylenically unsaturated group and/or a carboxyl group. When component (A) contains an ethylenically unsaturated group, the soldering heat resistance and chemical resistance are further enhanced since both component (A) and component (B) will be copolymerizable by photoexposure, while the developing performance may be enhanced if component (A) has a carboxyl group. Component (B) preferably also comprises a urethane (meth)acrylate with a carboxyl group.

As the photosensitive resin for photoexposure and alkali development there may also be used, in addition to the aforementioned type of resin, a photosensitive resin composition comprising (a) an epoxy resin with an ethylenically unsaturated group, (b) an elastomer, (c) a photopolymerizable reactive diluent, (d) a photoinitiator and (e) a curing agent which is reactive with the functional group of at least one of component (a), component (b) and component (c), wherein at least one of component (a), component (b) and component (c) comprises a compound with a carboxyl group.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the permanent resist, permanent resist fabrication process and permanent resist-laminated substrate according to the invention will now be explained.

The metal carboxylate group of the permanent resist may be represented, for example, by the following general formula (I). Here, X represents an n-valent metal ion, and n represents the valency of the metal ion.

(I)

A permanent resist of the invention comprises a metal carboxylate group such as a group represented by general formula (I) above, and optionally further comprises a carboxyl group in addition to the a metal carboxylate group, with an alkaline earth metal carboxylate group constituting at least 30 mole percent of the total of the a carboxyl group and a metal carboxylate group. That is, groups of general formula (I) above wherein X is an alkaline earth metal and n is 2 constitute 30–100 mole percent (preferably 50–100 mole percent, and more preferably 70–100 mole percent) of the total carboxyl and a metal carboxylate group. When alkali metal carboxylate group are used as the a metal carboxylate group, an alkaline earth metal carboxylate group content of less than 30 mole percent may result in an insufficient moisture-resistant insulating property.

As examples of an alkaline earth metal forming the an alkaline earth metal carboxylate group there may be mentioned calcium (Ca), magnesium (Mg), strontium (Sr), barium (Ba), radium (Ra), beryllium (Be) and the like. Among these, calcium (Ca) or magnesium (Mg) are preferred as alkaline earth metals from the standpoint of improved moisture-resistant insulating property of the permanent resist surface, and availability.

The alkaline earth metal carboxylate group content based on the total a carboxyl group and a metal carboxylate group may be determined by the following measurement method. Specifically, the permanent resist may be formed on a substrate and 1 g thereof shaved off and placed in a heat-resistant Teflon™ container together with 30 mL of purified water having an electric conductivity of 18 MΩ or greater and subjected to heat treatment at 100–120° C. for 4–8 hours for heat extraction of the ion components, after which the extracted sample may be returned to ordinary temperature and an ion chromatograph (for example, Model DX Ion Chromatograph by DIONEX Corp.) or atomic absorption photospectrometer (for example, Model Z5010 by Hitachi, Ltd.) used to quantify the metal cation component and concentration in the permanent resist.

The alkaline earth metal carboxylate group content may alternatively be determined by quantifying the metal cation concentration in the developing solution after development or the rinsing solution after rinsing by ion chromatography, and calculating the quantity of metal cations replaced by the development or rinsing.

The groups represented by general formula (I) above may be analyzed with an EPMA(XMA) (Electron Probe X-ray Microanalysis (X-ray Microanalyzer)), such as EDAX DX-PRIME by Nihon Phillips Co., Ltd.

The process for forming the permanent resist of the invention on a substrate to obtain a permanent resist-laminated substrate may be any of the following producing processes (1) to (4). These fabrication processes form a permanent resist on a substrate, and the permanent resist may even function as an insulating layer or protective layer on the substrate.

(1) A producing process whereby a layer of a photosensitive resin composition (comprising a carboxyl group-containing compound) formed on a substrate is irradiated with an active light ray and then developed and rinsed with a metal ion-containing rinsing solution.

(2) A producing process whereby a layer of a photosensitive resin composition (comprising a carboxyl group-containing compound) formed on a substrate is irradiated with an active light ray and then developed with a metal ion-containing developing solution and rinsed.

(3) A producing process whereby a layer of a photosensitive resin composition (comprising a carboxyl group-containing compound) formed on a substrate is irradiated with an active light ray and then developed with a metal ion-containing developing solution and rinsed with a metal ion-containing rinsing solution.

(4) A producing process whereby a layer of a photosensitive resin composition (comprising a carboxyl group-containing compound) formed on a substrate is irradiated with an active light ray and then developed with a metal ion-containing developing solution.

The aforementioned substrate may be, for example, a semiconductor package board or flexible wiring board such as a single-layer printed wiring board, multilayer printed wiring board, CSP, BGA or the like, with a flexible wiring board being preferred, or a wiring-formed board also being preferred. The substrate may also possess through-holes.

The process for laminating the photosensitive resin composition on the substrate may be, in the case of a liquid photosensitive resin composition, spray coating, electrostatic coating, roll coating, curtain coating, spin coating, silk screen printing, dip coating, electrodeposition coating, or the like. When the photosensitive resin composition is in solid form, the lamination is preferably performed using a photosensitive element comprising a layer composed of the photosensitive resin composition formed on a support (polyester film, etc.). The lamination method may be, for example, one whereby the photosensitive element is placed on the substrate (with the photosensitive resin composition layer contacting the substrate) and the photosensitive resin composition layer is contact bonded therewith while heating. In this case, the heating temperature is preferably about 70–130° C. and the contact bonding is preferably accomplished at a pressure of about 0.1–1 MPa.

The photosensitive resin composition layer formed on the substrate may have any desired thickness, but is preferably 0.1–100 μm and more preferably 3–50 μm. The an active light ray irradiated for photoexposure may be ultraviolet rays or visible rays from, for example, a carbon arc lamp, mercury vapor arc lamp, high-pressure mercury lamp or xenon lamp. When the photosensitive resin composition is photoexposed in a pattern, this may be accomplished by, for example, irradiating the an active light ray through a negative mask pattern or positive mask pattern. Laser direct imaging exposure may also be employed.

The photosensitive resin composition may be either a positive type or negative type. When the photosensitive resin composition is a negative type, the exposed sections are cured by irradiation of the an active light ray and the unexposed sections are removed by development. When the photosensitive resin composition is a positive type, irradiation of the an active light ray dissolves the exposed sections, or forms ions therein thereby improving dissolution in the developing solution, such that the exposed sections are removed by development.

There are no particular restrictions on the developing method, and for example, development may be accomplished by wet development using as the developing solution an alkali aqueous solution, aqueous developing solution, organic solvent or the like, and a patterned permanent resist may be formed by, for example, a dip system, spray system, brushing, slapping or the like.

As examples of alkali aqueous solutions to be used for the developing solution there may be mentioned 0.1–5 wt % sodium carbonate dilute solution, 0.1–5 wt % potassium carbonate dilute solution and 0.1–5 wt % sodium hydroxide dilute solution. The pH of the alkali aqueous solution is preferably in the range of 9–11, and the temperature of the developing solution may be adjusted as suitable for the developing property of the photosensitive resin composition layer.

When forming the permanent resist, either or both the developing solution and rinsing solution contain an alkaline earth metal ion. As examples of alkaline earth metal ions there may be mentioned calcium ion, magnesium ion, strontium ion, barium ion, radium ion and beryllium ion, among which calcium ion ($Ca^+$) and magnesium ion ($Mg^{2+}$) are preferred.

If either or both the developing solution and rinsing solution contain an alkaline earth metal ion, the a carboxyl group in the formed permanent resist may be in the form of an alkaline earth metal carboxylate group. When all or a portion of the a carboxyl group are present as non-an alkaline earth metal carboxylate group, they may be replaced with an alkaline earth metal carboxylate group. This may be done to increase the alkaline earth metal carboxylate proportion to at least 30 mole percent (preferably at least 50 mole percent, and more preferably at least 70 mole percent) based on the total a carboxyl group and a metal carboxylate group.

As methods for adding alkaline earth metal ions to the developing solution or rinsing solution there may be mentioned methods wherein alkaline earth metal salts such as magnesium sulfate, magnesium chloride, sodium chloride, potassium chloride, sodium sulfate, potassium sulfate, magnesium hydroxide, calcium chloride, calcium sulfate, iron sulfate, copper carbonate and the like are mixed with or dissolved in the developing solution or rinsing solution.

When the developing solution comprises an alkaline earth metal ion, it is preferably in an amount of 1–10,000 ppm, more preferably 10–2000 ppm and most preferably 50–500 ppm based on weight. The development is preferably conducted at 15–40° C. for about 15 seconds to 5 minutes, from the standpoint of workability and productivity.

After development, the permanent resist is preferably rinsed with water to wash off the developing solution, and as examples of rinsing solutions there may be mentioned tap water, well water, purified water, ion-exchanged water and the like.

When the developing solution comprises an alkaline earth metal ion, the rinsing solution used need not contain an alkaline earth metal ion, but in any case the rinsing solution preferably still contains an alkaline earth metal ion.

When the rinsing solution contains an alkaline earth metal ion, it is preferably in an amount of 1–10,000 ppm, more preferably 10–2000 ppm and most preferably 50–500 ppm based on weight. The rinsing is preferably conducted at 15–40° C. for about 15 seconds to 5 minutes, from the standpoint of workability and productivity.

After development and rinsing, the layer is preferably subjected to ultraviolet irradiation with a high-pressure mercury lamp, or heating, in order to enhance the heat resistance and chemical resistance. The ultraviolet radiation dose will usually be about 0.2–10 $J/cm^2$, with heating at about 60–160° C. preferred during the irradiation. Heating may be carried out in the range of about 100–170° C. for approximately 15–90 minutes. Both ultraviolet irradiation and heating may also be carried out in any desired order.

The photosensitive resin composition used for the invention may be one comprising (A) a binder polymer, (B) a photopolymerizable compound having an ethylenically unsaturated group, and (C) a photoinitiator. Component (A) and/or component (B) contain compounds with a carboxyl group.

The photosensitive resin composition used for the invention may also be one comprising (a) an epoxy resin with an ethylenically unsaturated group, (b) an elastomer, (c) a photopolymerizable reactive diluent, (d) a photoinitiator and (e) a curing agent which is reactive with the functional group of at least one of component (a), component (b) and component (c). In this case, at least one of component (a), component (b) and component (c) contains a compound with a carboxyl group.

Consequently, the carboxyl group or the metal carboxylate group in the permanent resist are derived from the aforementioned "compound with a carboxyl group". Also, as mentioned above, the photosensitive resin composition may be in the form of a liquid or a photosensitive element.

As examples of component (A) there may be mentioned polyester resins, acryl-based resins, styrene-based resins, epoxy-based resins, amide-based resins, amidoepoxy-based resins, alkyd-based resins, phenol-based resins, urethane resins and the like. These binder polymers may be used alone or in combinations of 2 or more, with acryl-based resins being preferred from the standpoint of alkali developing properties.

Component (A) may be produced, for example, by polymerization or copolymerization of a polymerizable monomer by radical polymerization or the like. As examples of polymerizable monomers there may be mentioned styrene; styrene derivatives such as vinyltoluene and α-methylstyrene; acrylamide; acrylamide derivatives such as diacetoneacrylamide; acrylonitrile; vinyl ethers such as vinyl-n-butyl ether; (meth)acrylic acid esters such as (meth)acrylic acid alkyl esters, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth)acrylate and 2,2,3,3-tetrafluoropropyl (meth)acrylate; (meth)acrylic acid; substituted (meth)acrylic acids such as α-bromo(meth)acrylic acid, α-chloro(meth)acrylic acid, β-furyl(meth)acrylic acid and β-styryl(meth)acrylic acid; maleic acid; maleic anhydride; and maleic acid monoesters such as monomethyl maleate, monoethyl maleate and monoisopropyl maleate; as well as fumaric acid, cinnamic acid, α-cyanocinnamic acid, itaconic acid, crotonic acid, propiolic acid and the like. Styrene derivatives are compounds wherein hydrogen atoms of styrene have been substituted with substituents (for example, organic groups such as alkyl, or halogen atoms).

The binder polymer (A) preferably consists of one or more types of polymers with a carboxyl group. A polymer with a carboxyl group may be produced, for example, by polymerization (for example, radical polymerization) of a polymerizable monomer having a carboxyl group (carboxyl group-containing monomer) with a polymerizable monomer having no a carboxyl group (carboxyl group-free monomer).

A carboxyl group-containing monomer preferably contains (meth)acrylic acid as an essential component, while a carboxyl group-free monomer preferably contains styrene and/or a styrene derivative as an essential component. As carboxyl group-free monomers other than styrene and styrene derivatives there may be mentioned the (meth)acrylic acid alkyl esters referred to above.

As examples of component (B) there may be mentioned compounds obtained by reacting α,β-unsaturated carboxylic acids with polyhydric alcohols; bisphenol A-based (meth) acrylate compounds; compounds obtained by reacting α,β-unsaturated carboxylic acids with glycidyl group-containing compounds; and urethane monomers such as (meth)acrylate compounds containing urethane bonds in the molecule; as well as nonylphenoxypolyoxyethylene acrylate; phthalic acid-based compounds such as γ-chloro-β-hydroxypropyl-β'-(meth)acryloyloxyethyl-o-phthalate and β-hydroxyalkyl-β'-(meth)acryloyloxyalkyl-o-phthalate; and (meth)acrylic acid alkyl esters.

As bisphenol A-based (meth)acrylate compounds there may be mentioned 2,2-bis(4-((meth)acryloxypolyethoxy) phenyl)propane, 2,2-bis(4-((meth)acryloxypolypropoxy) phenyl)propane, 2,2-bis(4-((meth)acryloxypolybutoxy) phenyl)propane, 2,2-bis(4-((meth) acryloxypolyethoxypolypropoxy)phenyl)propane and the like, and as component (B) with a carboxyl group there may be mentioned (meth)acrylic acid.

As examples of component (C) there may be mentioned benzophenone; N,N'-tetraalkyl-4,4'-diaminobenzophenone; aromatic ketones such as 2-benzyl-2-dimethylamino-1-(4-morpholinophenyl)-butanone-1 and 2-methyl-1-[4-(methylthio)phenyl]-2-morpholino-propanone-1; quinones such as alkylanthraquinones; benzoin ether compounds such as benzoinalkyl ethers; benzoin compounds such as benzoin and alkylbenzoins; benzyl derivatives such as benzyldimethylketal; 2,4,5-triarylimidazole dimer; acridine derivatives such as 9-phenylacridine and 1,7-bis(9,9'-acridinyl)heptane; N-phenylglycine; N-phenylglycine derivatives, coumarin-based compounds, and the like.

As component (a) there may be mentioned compounds obtained by reacting compounds having ethylenically unsaturated groups and a carboxyl group (such as (meth)acrylic acid), with epoxy resins such as novolac epoxy resin, bisphenol A epoxy resin, bisphenol F epoxy resin, salicylaldehyde epoxy resin and the like. The reaction is believed to occur between the a carboxyl group of the compound having ethylenically unsaturated groups and a carboxyl group, and the epoxy groups of the epoxy resin, whereby the epoxy rings are opened and ethylenically unsaturated bonds are introduced into the epoxy resin. A hydroxyl group is produced by opening of each epoxy ring, and subsequent reaction of an acid anhydride with the hydroxyl group can introduce a carboxyl group into the epoxy resin with ethylenically unsaturated groups.

As component (b), there may be mentioned styrene-based elastomers such as styrene-butadiene-styrene block copolymer and styrene-isoprene-styrene block copolymer; olefin-based elastomers such as ethylene-propylene copolymer (EPR), ethylene-propylene-diene copolymer (EPDM) and ethylene-α-olefin copolymer rubber; urethane-based elastomers comprising a hard segment composed of a low molecular glycol and diisocyanate and a soft segment composed of a high molecular (long-chain) diol and diisocyanate; polyester-based elastomers obtained by polycondensation of dicarboxylic acids and diol compounds; polyether block amide-type and polyether ester block amide-type polyamide-based elastomers; acryl-based elastomers such as acrylonitrile-butyl acrylate copolymer and acrylonitrile-butyl acrylate-ethyl acrylate copolymer; and silicon-based elastomers composed mainly of organopolysiloxanes.

As components (c) and (d), there may be mentioned the same compounds as for components (B) and (C) above. As component (e), there may be mentioned compounds having functional groups that are reactive with the hydroxyl and a carboxyl group of components (a), (b) or (c), and examples thereof include epoxy compounds, melamine compounds, urea compounds and oxazoline compounds.

Any of the photosensitive resin compositions described above may further contain, if necessary, added thermosetting agents, dyes, pigments, leveling agents, photocoloring agents, cohesion enhancers, plasticizers, and the like.

EXAMPLES

Preferred examples of the invention will now be explained in detail, with the implied understanding that the invention is in no way limited by these examples. The "parts" and "%" values referred to in the following explanation are all based on weight.

<Synthesis of Urethane Resin>

After introducing air into a reaction vessel equipped with a stirrer, thermometer, condenser tube and air introduction tube, there were charged 196.8 parts of polycarbonate diol (PLACCEL CD205PL, average molecular weight: 500, product of Daicel Chemical Industries, Ltd.), 58.3 parts of dimethylolbutanoic acid (product of Mitsubishi Chemical Corporation), 37.6 parts of diethyleneglycol (product of Maruzen Chemical Co., Ltd.), 148.1 parts of 1,4-cyclohexanedimethanol monoacrylate (product of Mitsubishi Chemical Corporation), 0.55 part of p-methoxyphenol (product of Wako Pure Chemical Industries, Ltd.), 0.55 part of dibutyltin laurate (L101, product of Tokyo Fine Chemical Co., Ltd.) and 110.2 parts of methylethyl ketone (product of Tonen Chemical Corp.), and the temperature was increased to 65° C. while stirring under an air stream.

In a dropping vessel there was charged 305.9 parts of trimethylhexamethylene diisocyanate (VESTANAT TMDI, product of Hüls, Japan), and this was evenly added dropwise to the reaction vessel over a period of 3 hours while maintaining a temperature of 65±3° C. After completion of the dropwise addition, the dropping vessel was rinsed with 76.5 parts of methylethyl ketone and the rinsing solution was placed in the reaction vessel. After 2 hours of incubation while stirring, the temperature was raised to 75° C.

Next, stirring incubation was then continued at 75±3° C. until disappearance of the isocyanate peak in the infrared absorption spectrum. The isocyanate peak disappeared within approximately 6–8 hours. Upon confirming disappearance of the peak, the temperature was lowered to 60° C., 9.3 parts of methanol (product of Wako Pure Chemical Industries, Ltd.) was added and the mixture was incubated for 30 minutes at 60±3° C. Next, 56.4 parts of methylethyl ketone was added to obtain a transparent urethane resin solution. The urethane resin had a solid portion of 75.6%, an acid value of 22.2 mgKOH/g and a viscosity of 1810 cP.

<Fabrication of Photosensitive Element>

A solution with the photosensitive resin composition shown in Table 1 was evenly coated onto a 19 μm-thick polyethylene terephthalate film, dried for 10 minutes with a hot air convection drier at 95° C. for removal of the solvent, and then laminated with a 25 μm-thick polyethylene film as a protective film, to obtain a photosensitive element. The post-drying thickness of the photosensitive resin composition layer was 38 μm.

TABLE 1

| Materials | | Content |
|---|---|---|
| Component (A) | Solution comprising copolymer of methacrylic acid, methyl methacrylate, ethyl acrylate, styrene mixed in weight ratio of 26:34:20:20, with weight-average molecular weight of 70,000 and acid value of 169.6 mgKOH/g, dissolved in methyl cellosolve/toluene (6/4 weight ratio) to solid content of 40 wt %. | 175 g (70 g solid portion) |
| Component (B) | 2,2'-bis(4-methacryloxypentaethoxyphenyl) propane | 36 g |
| | Urethane resin obtained in Synthesis Example 1 | 44 g (33 g solid portion) |
| Component (C) | Benzophenone | 3.5 g |
| | N,N'-tetraethyl-4,4'-diaminobenzophenone | 0.1 g |
| Other | 75 wt % methylethyl ketone solution of blocked isocyanate compound obtained by reacting isocyanate compound*[1] of formula shown below with methylethyl ketone oxime*[2] as blocking agent. | 21.3 g (16 g solid portion) |
| | 1,3-bis(2',6'-dimethylphenyl)phosphoyl benzene | 40 g |
| | 5-amino-2-mercapto-1,3,4-thiadiazole | 0.4 g |
| | Malachite green | 0.02 g |
| | Dimethylformamide | 4 g |
| | Acetone | 85 g |

*[1] and *[2] in Table 1 represent the following:
*[1]: Isocyanate compound

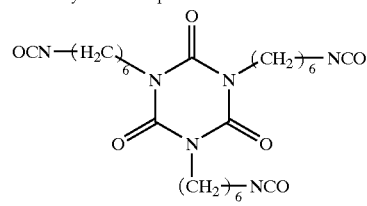

*[2]: Methylethyl ketone oxime (blocking agent)

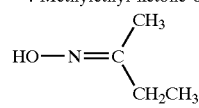

A test substrate obtained by forming a 50 μm line-and-space pattern on a flexible printed wiring board comprising a polyimide base laminated with 18 μm copper foil (trade name: F30VC1, product of Nikkan Industries Co., Ltd.) (hereinafter referred to as "FPC") was laminated with the aforementioned photosensitive element using a continuous vacuum laminator (Model HML-V570, product of Hitachi Chemical Co., Ltd.), with a heat shoe temperature of 120° C., a laminating speed of 0.5 m/min, an air pressure of $\leq 4.0 \times 10^3$ Pa and a contact bonding pressure of $3.0 \times 10^5$ Pa, while peeling off the polyethylene film.

After allowing this to stand at room temperature for over an hour, a prescribed negative mask pattern was adhered over the polyethylene terephthalate film of the sample and exposed to a prescribed irradiation dose (dose necessary to obtain 8/21 steps with 21-step tablet by Eastman-Kodak Corp.) using a Model HMW-201GX exposure apparatus by Oak Manufacturing Co., Ltd.

Example 1

The sample was allowed to stand at room temperature for 10 minutes after exposure, the polyethylene terephthalate was removed, and a developing solution at 30° C., comprising calcium chloride mixed and dissolved in a 1 wt % washing soda solution in an amount for a Ca ion content of 10 ppm, was used for 45 seconds of spray development of the unexposed sections of the photosensitive resin composition layer. After the spray development, a rinsing solution at 30° C., comprising calcium chloride mixed and dissolved in purified water in an amount for a Ca ion content of 90 ppm, was used for 150 seconds of spray rinsing of the exposed resist sections. Next, an ultraviolet exposure apparatus by Oak Manufacturing Co., Ltd. was used for ultraviolet exposure at 1 J/cm² and heat treatment was conducted at 160° C. for 60 minutes, to obtain an FPC sample bearing a patterned permanent resist. The alkaline earth metal carboxylate content was $\geq 30$ mole percent based on the total carboxyl and a metal carboxylate group in the permanent resist.

Examples 2–7

An FPC sample bearing a patterned permanent resist was obtained in the same manner as Example 1, except that the developing solutions and rinsing water shown in Table 2 were used as the developing solution and rinsing water of Example 1. The alkaline earth metal carboxylate contents were all $\geq 30$ mole percent based on the total of the carboxyl and a metal carboxylate group in the permanent resist.

Comparative Example 1

An FPC sample bearing a patterned permanent resist was obtained in the same manner as Example 1, except that a 1% washing soda solution at 30° C. was used as the developing solution and purified water at 30° C. was used as the rinsing water of Example 1. The alkaline earth metal carboxylate content was less than 30 mole percent based on the total of the carboxyl and a metal carboxylate group in the permanent resist.

Comparative Example 2

An FPC sample bearing a patterned permanent resist was obtained in the same manner as Example 1, except that a 1% washing soda solution at 30° C. was used as the developing solution and a solution at 30° C., comprising sodium chloride mixed and dissolved in purified water in an amount for a Na ion content of 100 ppm, was used as the rinsing water of Example 1. The alkaline earth metal carboxylate content was less than 30 mole percent based on the total of the carboxyl and a metal carboxylate group in the permanent resist.

Table 2 shows the details of the developing process for Examples 1–7 and Comparative Examples 1 and 2.

TABLE 2

|  | Developing solution composition | Metal salt added to developing solution | | Metal salt added to rinsing water | |
|---|---|---|---|---|---|
|  |  | Type | Metal ion content | Type | Metal ion content |
| Example 1 | 1% washing soda solution | calcium chloride | 10 ppm | calcium chloride | 90 ppm |
| Example 2 | 1% washing soda solution | — | — | calcium chloride | 100 ppm |
| Example 3 | 1% washing soda solution | calcium chloride | 200 ppm | — | — |
| Example 4 | 1% washing soda solution | magnesium chloride | 10 ppm | magnesium chloride | 90 ppm |
| Example 5 | 1% washing soda solution | — | — | magnesium chloride | 100 ppm |
| Example 6 | 1% washing soda solution | magnesium chloride | 200 ppm | — | — |
| Example 7 | 1% washing soda solution | — | — | calcium chloride | 50 ppm |
|  |  |  |  | magnesium chloride | 50 ppm |
| Comp. Ex. 1 | 1% washing soda solution | — | — | — | — |
| Comp. Ex. 2 | 1% washing soda solution | — | — | sodium chloride | 100 ppm |

The (1) moisture-resistant insulating property, (2) soldering heat resistance, (3) folding strength, (4) chemical resistance and (5) solvent resistance of each of the FPC samples of Examples 1–7 and Comparative Examples 1 and 2 were measured by the following methods. The results are shown in Tables 3 and 4.

(1) Moisture-resistant Insulating Property

After coating the electrolyte terminal section of the FPC sample with a rosin-based flux, MH-820V (product of Tamura Kaken Co., Ltd.), a soldering iron was used to form a connection between the anode/cathode and Teflon-shielded wire using bobbin-wound solder. The FPC sample was then allowed to stand in a hygrothermostat at 60° C., 90% RH, and the connected Teflon-shielded sire was connected to a voltage generator for application of 6V for 1000 hours. Following this procedure, the condition of air bubbles and peeling in the permanent resist pattern on the FPC was visually evaluated based on the following scale.

Good: No air bubbles or peeling produced.

Poor: Air bubbles or peeling produced.

(2) Soldering Heat Resistance

After coating the permanent resist of the FPC sample with a rosin-based flux, MH-820V (product of Tamura Kaken Co., Ltd.), it was immersed in a soldering bath at 260° C. for 30 seconds for soldering treatment. Following this procedure, the condition of cracks in the permanent resist layer and the condition of air bubbles or peeling in the permanent resist from the FPC were visually evaluated based on the following scale.

Good: No cracks, air bubbles or peeling produced.

Poor: Cracks, air bubbles or peeling produced.

(3) Folding Strength

The FPC sample which had been subjected to soldering treatment at 260° C. for 10 seconds was folded 180° by button punch snap folding, and the condition of cracks in the permanent resist layer upon folding was visually evaluated based on the following scale.

Good: No cracks

Poor: Cracks (4) Chemical Resistance

The FPC sample was immersed in a 2N hydrochloric acid solution at ordinary temperature for 15 minutes, and the condition of penetration and air bubbles at the openings in the permanent resist pattern from the FPC was visually evaluated based on the following scale.

Good: No penetration or air bubbles.

Poor: Penetration or air bubbles.

(5) Solvent Resistance

The FPC sample was immersed in isopropyl alcohol at ordinary temperature for 5 minutes, and the condition of swelling and air bubbles in the permanent resist layer from the FPC was visually evaluated based on the following scale.

Good: No swelling or air bubbles.

Poor: Swelling or air bubbles.

TABLE 3

|  | Example | | | | |
|---|---|---|---|---|---|
| Evaluated property | 1 | 2 | 3 | 4 | 5 |
| Exposure dose: mJ/cm$^2$ (ST = 8/21 steps) | 100 | 100 | 100 | 100 | 100 |
| (1) Moisture-resistant insulating property (60° C. purified water immersion/6 V application/60 min) | good | good | good | good | good |
| (2) Soldering heat resistance (260° C./30 sec) | good | good | good | good | good |
| (3) Folding strength (180°/button punch snap folding) | good | good | good | good | good |
| (4) Chemical resistance (2N hydrochloric acid/ordinary temperature/15 min immersion) | good | good | good | good | good |
| (5) Solvent resistance (isopropyl alcohol/ordinary temperature/5 min immersion) | good | good | good | good | good |

TABLE 4

|  | Example | | Comp. Ex. | |
|---|---|---|---|---|
| Evaluated property | 6 | 7 | 1 | 2 |
| Exposure dose: mJ/cm$^2$ (ST = 8/21 steps) | 100 | 100 | 100 | 100 |

TABLE 4-continued

|  | Example | | Comp. Ex. | |
|---|---|---|---|---|
| Evaluated property | 6 | 7 | 1 | 2 |
| (1) Moisture-resistant insulating property (60° C. purified water immersion/6 V application/60 min) | good | good | poor | poor |
| (2) Soldering heat resistance (260° C./30 sec) | good | good | good | good |
| (3) Folding strength (180°/ button punch snap folding) | good | good | good | good |
| (4) Chemical resistance (2N hydrochloric acid/ordinary temperature/15 min immersion) | good | good | good | good |
| (5) Soivent resistance (isopropyl alcohol/ordinary temperature/5 min immersion) | good | good | good | good |

As explained above, the present invention provides a permanent resist exhibiting a high moisture-resistant insulating property as well as excellent flexibility, soldering heat resistance and chemical resistance. It also provides a permanent resist-laminated substrate comprising the permanent resist, and a process for its fabrication.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A permanent resist obtained by at least photoexposure and alkali development of a photosensitive resin composition,
   said permanent resist containing a metal carboxyldte group, or a carboxyl group and a metal carboxylate group,
   wherein an alkaline earth metal carboxylate group constitutes at least 30 mole percent of the total of the carboxyl group and the metal carboxylate group.

2. A permanent resist according to claim 1, wherein said alkaline earth metal carboxylate group constitutes at least 50 mole percent of the total of the carboxyl group and the metal carboxylate group.

3. A permanent resist according to claim 1, wherein said alkaline earth metal carboxylate group constitutes at least 70 mole percent of the total of the carboxyl group and the metal carboxylate group.

4. A permanent resist according to claim 1, wherein said alkaline earth metal is calcium or magnesium.

5. A permanent resist according to claim 1, wherein said photosensitive resin composition comprises:
   (A) a binder polymer,
   (B) a photopolymerizable compound having an ethylenically unsaturated group, and
   (C) a photoinitiator,
   wherein said component (A) and/or component (B) comprise a compound with a carboxyl group.

6. A permanent resist according to claim 5, wherein said component (A) comprises a binder polymer having an ethylenically unsaturated group.

7. A permanent resist according to claim 5, wherein said component (A) comprises a binder polymer with a carboxyl group.

8. A permanent resist according to claim 5, wherein said component (B) comprises a urethane (meth)acrylate with a carboxyl group.

9. A permanent resist according to claim 1, wherein said photosensitive resin composition comprises:
   (a) an epoxy resin having an ethylenically unsaturated group,
   (b) an elastomer,
   (c) a photopolymerizable reactive diluent,
   (d) a photoinitiator, and
   (e) a curing agent which is reactive with a functional group of at least one of component (a), component (b) and component (c),
   wherein at least one of said component (a), component (b) and component (c) comprises a compound with a carboxyl group.

10. A permanent resist-laminated substrate comprising a substrate and a permanent resist according to claim 1 formed on said substrate.

11. A permanent resist-laminated substrate comprising a substrate and a permanent resist according to claim 4 formed on said substrate.

12. A permanent resist-laminated substrate comprising a substrate and a permanent resist according to claim 5 formed on said substrate.

13. A permanent resist-laminated substrate comprising a substrate and a permanent resist according to claim 9 formed on said substrate.

* * * * *